US012123926B2

(12) United States Patent
Maerz (10) Patent No.: US 12,123,926 B2
(45) Date of Patent: Oct. 22, 2024

(54) REDUNDANT CURRENT SENSOR

(71) Applicant: Infineon Technologies AG, Neubiberg (DE)

(72) Inventor: Sebastian Maerz, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 17/814,883

(22) Filed: Jul. 26, 2022

(65) Prior Publication Data

US 2023/0031975 A1    Feb. 2, 2023

(30) Foreign Application Priority Data

Aug. 2, 2021 (DE) .......................... 102021120034.2

(51) Int. Cl.
*G01R 33/00* (2006.01)
*G01R 33/09* (2006.01)

(52) U.S. Cl.
CPC ....... *G01R 33/093* (2013.01); *G01R 33/0005* (2013.01); *G01R 33/0094* (2013.01); *G01R 33/098* (2013.01)

(58) Field of Classification Search
CPC ............ G01R 33/0005; G01R 33/0094; G01R 33/098; G01R 33/093
See application file for complete search history.

(56) References Cited

U.S. PATENT DOCUMENTS

| | | | |
|---|---|---|---|
| 6,600,638 B2 | 7/2003 | Gill | |
| 6,836,392 B2 | 12/2004 | Carey et al. | |
| 7,606,008 B2 | 10/2009 | Sbiaa et al. | |
| 7,672,089 B2 | 3/2010 | Lin | |
| 7,750,620 B2 | 7/2010 | Guo et al. | |
| 8,208,228 B2 | 6/2012 | Maat et al. | |
| 9,091,688 B2 | 7/2015 | Bangert | |
| 9,116,531 B2 | 8/2015 | Alley | |
| 9,859,489 B2 | 1/2018 | Doogue et al. | |
| 10,436,843 B2 | 10/2019 | Lovell et al. | |
| 10,866,287 B1* | 12/2020 | Lassalle-Balier | .... G01R 33/098 |
| 2007/0035890 A1 | 2/2007 | Sbiaa | |
| 2007/0211392 A1 | 9/2007 | Zeltser | |
| 2008/0112095 A1 | 5/2008 | Carey et al. | |
| 2009/0015252 A1* | 1/2009 | Raberg | ................... B82Y 25/00 324/252 |
| 2012/0161263 A1 | 6/2012 | Maat et al. | |
| 2013/0099783 A1* | 4/2013 | Kubik | ................ G01R 33/0005 324/252 |
| 2014/0285188 A1* | 9/2014 | Kuwano | ................ G01D 5/145 324/252 |
| 2015/0016163 A1* | 1/2015 | Krainer | .............. G01R 19/0092 363/78 |

(Continued)

FOREIGN PATENT DOCUMENTS

CN    202421294 U    9/2012
CN    102928651 A    2/2013

(Continued)

*Primary Examiner* — Alesa Allgood
(74) *Attorney, Agent, or Firm* — Harrity & Harrity, LLP (57) ABSTRACT

The present disclosure relates to a redundant current sensor (100), comprising, in a common chip package (20), a first integrated magnetoresistive sensor circuit (110A) and a second integrated magnetoresistive sensor circuit (110B).

20 Claims, 9 Drawing Sheets

(56) References Cited

U.S. PATENT DOCUMENTS

2018/0164387 A1* 6/2018 Raberg .................. G01R 33/098
2020/0217908 A1 7/2020 Deak et al.

FOREIGN PATENT DOCUMENTS

| CN | 103197132 A | 7/2013 |
| CN | 108226824 A | 6/2018 |
| CN | 207675817 U | 7/2018 |
| DE | 102008061014 A1 | 6/2010 |
| DE | 112009002337 T5 | 7/2011 |
| DE | 102008030334 B4 | 2/2018 |
| DE | 102017129346 A1 | 6/2018 |
| DE | 112018001815 T5 | 12/2019 |
| DE | 112009000449 B4 | 1/2020 |
| DE | 112019001437 T5 | 12/2020 |
| EP | 3143649 B1 | 3/2017 |

* cited by examiner

REDUNDANT CURRENT SENSOR

CROSS REFERENCE TO RELATED APPLICATION

This application claims priority to German Patent Application No. 102021120034.2 filed on Aug. 2, 2021, the content of which is incorporated by reference herein in its entirety.

TECHNICAL FIELD

The present disclosure relates generally to current sensors and in particular to current sensors formed using magnetoresistive sensors.

BACKGROUND

Numerous technical systems contain monitoring sensors and forward signals of the sensors to the monitoring or control units. Monitoring sensors can determine important state parameters of the systems, such as temperature, voltage, or electric current, for example. In order to be able to satisfy customary safety specifications, the corresponding monitoring sensors can be embodied in redundant fashion.

In battery systems, for example, a significance is accorded to a measurement of the battery current, both when determining a state of charge and ensuring safe operation. An environment into which current flows or from which current comes may be a load or a charging device, for instance. There are a number of hazards attributable to an impermissibly high current. In the case of an overload of the battery, more current is made available by the battery than is permitted by the instantaneous state of the battery. This may be the case e.g., on account of the present temperature or a specific state of health of the battery. The overload of the battery possibly leads to the overheating thereof and may end in a dangerous state. A further hazard is overcurrent, which means that more current is made available by the battery than is able to be supplied by the cells in accordance with their specification. This, too, may lead to overheating of the battery. Yet another hazard is so-called lithium plating, which can occur during the charging of a battery at very low temperatures and with high currents. In this case, metallic lithium is deposited on an electrode, which may likewise be dangerous. Monitoring this is particularly critical since even exceeding by a small amount a non-critical charging current that does not lead to lithium plating can lead to an undetected fault in the battery. On account of the hazards mentioned, it is necessary to reliably measure currents from and to the battery. The result of a hazard and risk analysis reveals that the current measurement is to be classified in the safety classification ASIL C (ISO 26262) at least for applications in some vehicles.

It is difficult to realize sufficient measurement safety with a single-channel measurement, e.g. with only one sensor. Redundant current sensors are known, using either two separate Hall sensors on two analog-to-digital converters (ADCs) or one shunt resistor and one magnetic sensor (Hall sensor) on two ADC channels. As a result, a high degree of safety is achieved, but it is necessary to install two different measuring systems, which necessitates a significant amount of space and/or significant costs.

Therefore, there is a need for improved redundant current sensors.

SUMMARY

This need is met by devices and methods as claimed in the independent claims. The dependent claims relate to advantageous developments.

In accordance with a first aspect of the present disclosure, a redundant current sensor is proposed. The current sensor comprises a first integrated circuit having a first magnetoresistive sensor (xMR sensor) and a second integrated circuit having a second magnetoresistive sensor. The first and second integrated circuits are arranged in a common semiconductor package. As a result, in one semiconductor package it is possible to provide at least two independent channels for current sensing which require high coverage for functional safety. A small size resulting from the common integration of the magnetoresistive sensors into one package makes it possible for both sensors to detect the same magnetic field value or current.

The integrated magnetoresistive sensors based on the magnetoresistance effect can be configured as in each case integrated AMR (Anisotropic magnetoresistance), GMR (Giant magnetoresistance) or TMR (Tunnel magnetoresistance) sensors or as combinations thereof. The large number of different magnetoresistive effects is usually abbreviated to xMR, where the "x" serves as a placeholder for the different magnetoresistive effects.

In accordance with some example implementations, the first integrated magnetoresistive sensor has a first integrated bridge circuit (e.g. Wheatstone bridge) having first magnetoresistive (resistance) elements. The second integrated magnetoresistive sensor can have a second integrated bridge circuit (e.g. Wheatstone bridge) having second magnetoresistive (resistance) elements. Reliable measurement signals proportional to the electric current to be measured can be obtained by way of differential voltages between the respective bridge branches.

In accordance with some example implementations, the first and second integrated magnetoresistive sensors are configured to measure the same magnetic field component(s) of a magnetic field generated by a current. In other words, unlike in the case of an angle sensor, for example, the first and second magnetoresistive sensors of the current sensor do not output sin and cos signals phase-shifted by 90° for an angle calculation, rather both sensors measure for example in each case an x-component proportional to the current, in each case a y-component, or in each case a z-component of the magnetic field. A magnetic field component to be measured may lie in a plane of a measurement layer of the magnetoresistive (resistance) elements, also generally referred to as "in-plane".

In accordance with some example implementations, the first integrated circuit has a first amplifier and/or comparator circuit monolithically integrated with the first magnetoresistive sensor on a common semiconductor substrate. The second integrated circuit has a second amplifier and/or comparator circuit monolithically integrated with the second magnetoresistive sensor on a common semiconductor substrate. The respective amplifier and/or comparator circuits can have circuit components such as, for example, signal amplifiers, operational amplifiers, logic gates, transistors, etc. The magnetoresistive sensors can thus be monolithically integrated together with a respective amplifier and/or comparator circuit on a die, as a result of which the redundant current sensor in the semiconductor package can be embodied in a very small or space-saving fashion and with high accuracy. Furthermore, the magnetoresistive sensors can also be monolithically integrated together with respective ADCs and/or respective power supplies (Power Management Units, PMU) on a die.

In accordance with some example implementations, the first and second integrated circuits are arranged on a common semiconductor chip or die. All circuit components (first magnetoresistive sensor, second magnetoresistive sensor, respective amplifier and/or comparator circuits, etc.) can thus advantageously be integrated on a single semiconductor die.

Alternatively, the first and second integrated circuits can be arranged on different semiconductor chips (dies) and can be arranged for example on different sides of a leadframe in the semiconductor package. As a result, further space can be saved under certain circumstances.

In accordance with some example implementations, the first integrated circuit and the second integrated circuit are galvanically isolated from one another. The first integrated circuit and the second integrated circuit can thus have different reference potentials. If the integrated circuits are integrated in a common die, it is possible to provide for example in addition isolating decoupling trenches between the first and second integrated circuits in the semiconductor substrate. Interference for example during the transfer of measurement signals can thus be avoided.

In accordance with some example implementations, the first magnetoresistive sensor and the second magnetoresistive sensor are configured in each case as a TMR sensor. In accordance with some example implementations, the first magnetoresistive sensor has a first integrated bridge circuit (e.g. Wheatstone bridge) having first TMR (resistance) elements. The second magnetoresistive sensor can have a second integrated bridge circuit (e.g. Wheatstone bridge) having second TMR (resistance) elements. Tunnel magnetoresistance (TMR) is a magnetoresistive effect that occurs in a magnetic tunnel junction (MTJ). The latter is a component which consists of two ferromagnets separated by a thin insulator. If the insulator layer is thin enough (typically a few nanometers), electrons can tunnel from one ferromagnet into the other. Magnetic tunnel junctions can be produced using thin-film technology. Layer deposition can be effected by magnetron sputtering deposition, molecular beam epitaxy, pulsed laser deposition and electron beam physical vapor deposition. Electrical connections can be produced by photolithography.

In accordance with some example implementations, the first magnetoresistive sensor and the second magnetoresistive sensor have a magnetically free layer in a vortex configuration. In some applications, a sensor may be subject to interference in the form of unknown or unpredictable magnetic fields. This interference can arbitrarily change a state or an initial value of the sensor. Since a hysteresis behavior of the sensor can lead to a significant difference, regardless of whether a measured value is approached from an initial value above or below the measured value, the hysteresis can lead to an error in measurement results. A magnetic xMR sensor concept having a free layer in a vortex configuration can have approximately zero hysteresis. To put it another way, a low hysteresis can be achieved given the presence of a vortex-type magnetization state (magnetic field) in the free layer and may be of interest particularly for current sensing.

In accordance with some example implementations, the first magnetoresistive sensor and the second magnetoresistive sensor have the same magnetic sensing properties. By way of example, they can thus have identical measurement sensitivity. This can be achieved for example if both sensors are produced with identical magnetic layer stacks and reference magnetizations.

In accordance with some example implementations, the first magnetoresistive sensor and the second magnetoresistive sensor have different magnetic sensing properties. By way of example, they can thus have different measurement sensitivity. This can be achieved for example if both sensors are produced with at least partly different layer thicknesses and/or different reference magnetizations.

In accordance with some example implementations, the first/second integrated circuit is configured to indicate additional signals from the first and/or second magnetoresistive sensor by way of one comparator or a plurality of comparators. The first and/or second integrated circuit can be configured to indicate a zero crossing sensed by the first and/or second magnetoresistive sensor. The first and/or second integrated circuit can be configured to indicate an overcurrent (OCD) sensed by the first and/or second magnetoresistive sensor. Here threshold values for overcurrent can be set differently in each case. Fast sensing of an overcurrent in the measurement path is possible by way of an OCD pin. Connected to a logic input of a microcontroller, the OCD pin can for example trigger an interrupt in the microcontroller and if necessary shut down a system or protect it against damage.

In accordance with some example implementations, a distance between the first magnetoresistive sensor and the second magnetoresistive sensor in the semiconductor package is less than 3 mm, preferably less than 2 mm, even more preferably less than 1 mm. As a result, it is possible to ensure that both sensors measure the same magnetic field generated by the current.

In accordance with some example implementations, the redundant current sensor can furthermore comprise a logic circuit configured to compare a first sensor signal of the first magnetoresistive sensor with a second sensor signal of the second magnetoresistive sensor. The logic circuit can be situated additionally in the semiconductor package or for example as a microcontroller also outside the semiconductor package. The logic circuit can also be part of an external battery management system (BMS).

In accordance with a further aspect of the present disclosure, an arrangement for current measurement is provided, comprising a current conductor, a redundantly configured magnetic field sensor arranged at a distance from the current conductor, wherein the current sensor has in a common semiconductor package a first integrated circuit having a first magnetoresistive sensor and a second integrated circuit having a second magnetoresistive sensor. The arrangement additionally comprises a logic circuit (e.g. microcontroller, BMS) coupled to the redundantly configured magnetic field sensor and configured to compare a first sensor signal of the first magnetoresistive sensor with a second sensor signal of the second magnetoresistive sensor.

In accordance with a further aspect of the present disclosure, a method for current measurement is provided. The method comprises energizing a current conductor, arranging a redundantly configured magnetic field sensor at a distance from the current conductor, wherein the magnetic field sensor has in a common semiconductor package a first integrated circuit having a first magnetoresistive sensor and a second integrated circuit having a second magnetoresistive sensor, sensing, in response to the energized current conductor, a first sensor signal of the first magnetoresistive sensor and a second sensor signal of the second magnetoresistive sensor, and comparing the first sensor signal with the second sensor signal.

Since the small structural size of the magnetoresistive sensors allows integration into one package, the two sensors can sense the same field value. This yields second, redundant information that is advantageous for many requirements of functional safety pursuant to ISO 26262. Nevertheless, the two dies can/ought to have different supply and ground. The redundant xMR sensor can be positioned without contacting the current conductor and is inherently isolated from high voltages—that can considerably facilitate integration. Galvanic isolation can be realized by leadframe splitting or insulating adhesive, for example, in order to ensure the independence of both integrated sensor circuits. Intensified isolation requirements can also be satisfied using an external busbar. The two TMR sensors can even have different sensor characteristics for optimized resolutions or different designs for diversity with regard to ASIL. The combination of a die having e.g. a dedicated zero crossing pin and a die having e.g. a dedicated over current detection (OCD) pin makes it possible to realize a combination of two properties in a simple manner. A combination of positive and negative edges makes it possible to achieve a rapid check for faults having a common cause since the sum must be a constant value (ASIL, functional safety, common cause, external safety mechanism). The integrated WOC (Wire On Chip) structure enables the TMR sensors to be tested and calibrated without a magnetic test and even to be used in the application for employing functional tests. In addition, the WOC can be used for realizing a closed-loop measurement if a compensation current is applied. A high-frequency measurement capability (MHz range), a high signal-to-noise ratio, a wide linear range and a sensitivity—adaptable by technological and production parameters—of the xMR structure (see vortex structure) enable a broad range of implementations and applications.

BRIEF DESCRIPTION OF THE DRAWINGS

Some examples of devices and/or methods are explained in greater detail merely by way of example below with reference to the accompanying figures, in which.

DETAILED DESCRIPTION

Some examples will now be described more thoroughly with reference to the accompanying figures. However, further possible examples are not restricted to the features of these implementations described in detail. These may have modifications of the features and counterparts and alternatives to the features. Furthermore, the terminology used herein for describing specific examples is not intended to be limiting for further possible examples.

Throughout the description of the figures, identical or similar reference signs refer to identical or similar elements or features which can be implemented in each case identically or else in modified form, while they provide the same or a similar function. In the figures, furthermore, the thicknesses of lines, layers and/or regions may be exaggerated for elucidation purposes.

If two elements A and B are combined using an "or", this should be understood such that all possible combinations are disclosed, e.g. only A, only B, and A and B, unless expressly defined otherwise in an individual case. As alternative wording for the same combinations, it is possible to use "at least one from A and B" or "A and/or B". That applies equivalently to combinations of more than two elements.

If a singular form, e.g. "a, an" and "the", is used and the use of only a single element is defined neither explicitly nor implicitly as obligatory, further examples can also use a plurality of elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage describe the presence of the specified features, integers, steps, operations, processes, elements, components and/or a group thereof, but do not exclude the presence or the addition of one or more other features, integers, steps, operations, processes, elements, components and/or a group thereof.

Figure 1:
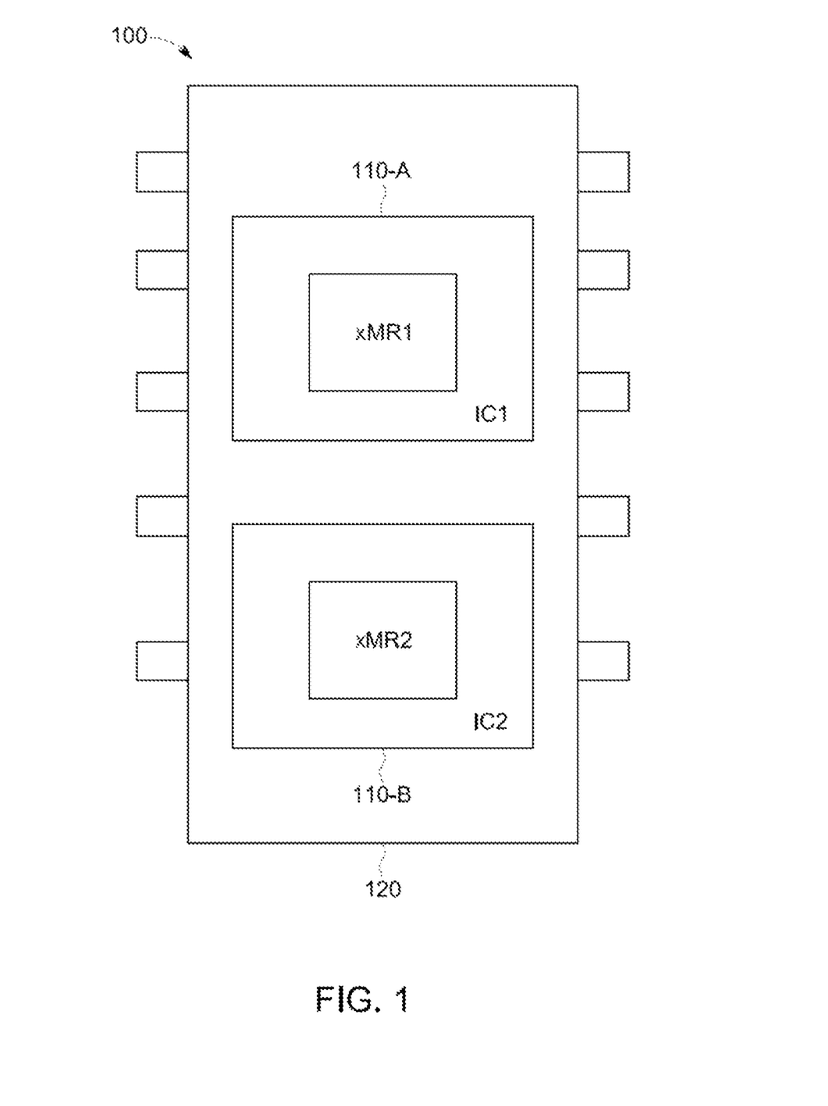
FIG. 1 schematically shows a redundantly configured current sensor in accordance with one example implementation of the present disclosure.

FIG. 1 schematically shows a redundantly configured current sensor 100 in accordance with one example implementation of the present disclosure.

The current sensor 100 comprises a first integrated xMR sensor circuit 110A and a second integrated xMR sensor circuit 110B. The first and second integrated xMR sensor circuits 110A, 110B are in this case arranged in a common semiconductor or chip package 120.

Both integrated xMR sensor circuits 110A, 110B here are integrated in or on a semiconductor substrate in each case using semiconductor production process steps. The two integrated xMR sensor circuits 110A, 110B can be monolithically integrated on a common die (of a semiconductor wafer). The two integrated xMR sensor circuits 110A, 110B can also each be integrated on different dies and mounted on a common leadframe, for example. In any case both integrated circuits 110A, 110B are situated in the common chip package 120. As will also be shown, the integrated xMR sensor circuits 110A, 110B of the redundantly configured current sensor 100 can also have, besides integrated xMR sensor elements (resistance elements), even further circuit elements monolithically integrated in or on the same semiconductor substrate, such as e.g. differential amplifiers for measurement voltages, comparators, operational amplifiers, DACs, etc.

By way of example, the integrated xMR sensor circuits 110A, 110B can have xMR resistance elements integrated in or on a semiconductor substrate modularly using BICMOS or CMOS technologies. The first integrated xMR sensor circuit 112A can have at least one first xMR resistance element integrated in a semiconductor substrate. The second integrated xMR sensor circuit 112B can have at least one second xMR resistance element integrated in a semiconductor substrate.

The xMR resistance elements can comprise, in principle, AMR resistance elements, GMR resistance elements, TMR resistance elements or combinations thereof. The first integrated xMR sensor circuit 110A and the second integrated xMR sensor circuit 110B can be based on the same xMR technology, but they can also implement different xMR technologies. Principles of the present disclosure are described below based on TMR resistance elements in the two xMR sensor circuits 110A, 110B. The first integrated xMR sensor circuit 110A can thus have at least one first TMR resistance element integrated in a semiconductor substrate. The second integrated xMR sensor circuit 110B can have at least one second TMR resistance element integrated in a semiconductor substrate.

In principle, TMR sensor components can be constructed modularly and relatively independently of the underlying semiconductor substrate or basic process. A monolithic integration of TMR sensor elements and conditioning integrated circuit is thus possible. Furthermore, an integrated ESD (electrostatic discharge) protection for protecting the TMR sensor element and also the integrated IC can be realized in a simple manner.

Figure 2:
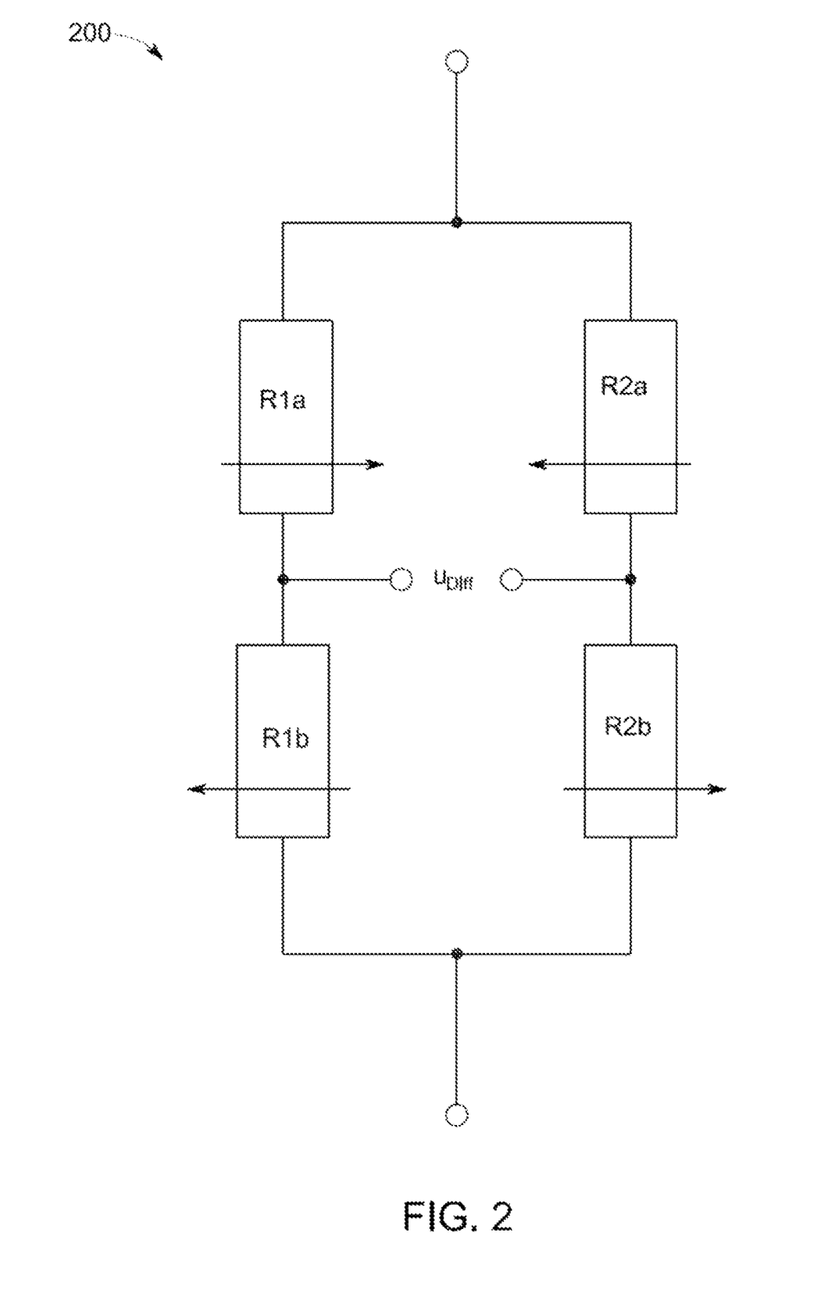
FIG. 2 shows a schematic Wheatstone bridge circuit composed of xMR resistance elements.

TMR sensor circuits are usually realized using Wheatstone bridge circuits. A schematic Wheatstone bridge circuit 200 having four TMR resistance elements R1a, R1b, R2a, R2b is shown in FIG. 2.

The first integrated TMR sensor circuit 110A can have a first integrated (Wheatstone) bridge circuit having four first TMR resistance elements R1a, R1b, R2a, R2b for providing a first differential measurement signal differential measurement voltage) $U_{Diff,1}$. Reference magnetizations of the TMR resistance elements R1a, R1b in a first bridge branch (first half-bridge) of the first integrated bridge circuit usually differ by 180° from reference magnetizations of the TMR resistance elements R2a, R2b in a second bridge branch (second half-bridge) of the first integrated bridge circuit. The reference magnetizations in the bridge branches can be for example parallel or antiparallel to a magnetic field component to be detected by the current sensor 100.

Equally, the second integrated TMR sensor circuit 110B can have a second integrated (Wheatstone) bridge circuit having second TMR resistance elements R1a, R1b, R2a, R2b for providing a second measurement signal (measurement voltage) $U_{Diff,2}$. Reference magnetizations of the TMR resistance elements in a first bridge branch (first half-bridge) of the second integrated bridge circuit likewise differ by 180° from reference magnetizations of the TMR resistance elements in a second bridge branch (second half-bridge) of the second integrated bridge circuit.

The reference magnetizations of the TMR resistance elements of the first integrated bridge circuit can correspond to the reference magnetizations of the TMR resistance elements of the second integrated bridge circuit, such that the first integrated TMR sensor circuit 110A and the second integrated TMR sensor circuit 110B are configured to redundantly measure the same magnetic field component(s) of a magnetic field generated by an electric current. Magnetic field components to be detected can lie within a plane of a measurement layer (free layer) of the respective TMR resistance elements.

Figure 3:
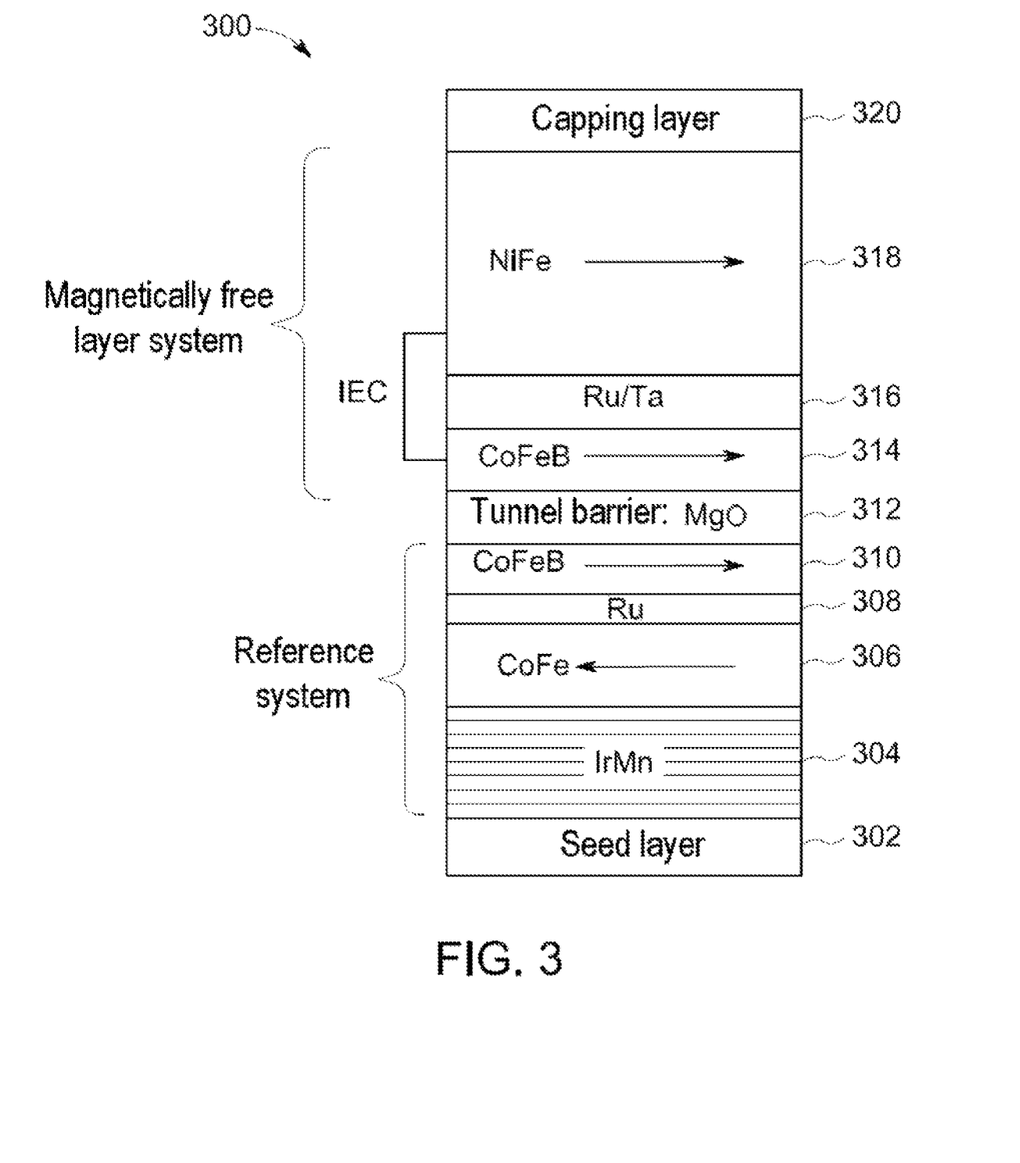
FIG. 3 shows an example TMR layer stack that is integrable using CMOS technology.

A description is given below, with reference to FIG. 3, of an example integration process for a TMR layer stack 300 as a basis for the TMR resistance elements of the integrated bridge circuits.

Any semiconductor substrate or any basic process wafer comprising TMR components should have at least one metal layer for the wiring and the formation of pads. A dielectric layer can be applied to the metal layer and planarized. A TMR stack 300 can then be deposited on this surface in a single pass. In accordance with one example implementation, main components of the stack 300 may be:

a) a seed layer 302, comprising Ta/CuN/Ta/Ru: the purpose of this component may be to ensure a texture for a formation of a crystal structure of an antiferromagnet and also smooth growth of subsequent layers and to create a low-resistance bottom electrode. One possible structure for the seed layer 302 is 5 nm Ta/20 nm CuN/5 nm Ta/2 nm Ru for PtMn as NAF material or 5 nm Ta/20 nm CuN/5 nm Ta/5 nm Ru/5 nm Ta for IrMn as NAF material.

b) A natural antiferromagnet (NAF) 304 on the seed layer 302, which can comprise either PtMn or IrMn. A possible thickness for PtMn is 15 nm and for IrMn is 10 nm.

c) An artificial antiferromagnet on the natural antiferromagnet (NAF) 304 having a pinning layer 306 comprising Co70Fe30, a coupling layer 308 composed of Ru on the pinning layer 306, a reference layer 310 composed of CoFeB on the coupling layer 308. The thickness of the magnetic layers should be kept as thin as possible in order to create a rigid reference system. However, a finite net moment is required in order to enable the alignment of the reference system with respect to the external field during a layer magnetization. A typical structure for the artificial antiferromagnet is 1.7 nm CoFe(30)/0.8 nm Ru/1.4 nm CoFeB.

d) A tunnel barrier 312 comprising MgO on the reference layer 310. While all the other stack components can be deposited using DC sputtering, MgO can be deposited by RF sputtering. A resistance of the tunnel junction depends exponentially on a thickness of the MgO. High signals can be achieved if MgO is deposited on an amorphous layer and the crystal structure forms during subsequent annealing at at least 280° C. A possible thickness for the MgO layer is 1.1 nm.

e) A magnetically free layer (FL) can in turn consist of a system of coupled ferromagnetic materials on the tunnel barrier 312. Firstly, a CoFeB layer 314 can be applied to the tunnel barrier 312 (MgO) in order to ensure high magnetic signals. However, CoFeB has an anisotropic behavior. NiFe is a better material for this purpose, but NiFe deposited directly on MgO or an intervening ferromagnetic layer can lead to a low signal. For this reason, an Ru layer 316 having a thickness of 1.2 nm can be inserted between CoFeB and NiFe 318. With this thickness Ru can provide for a ferromagnetic coupling between the two ferromagnetic layers 314, 318, but separates the texture of the NiFe from CoFeB. A typical structure for the magnetically free layer system is 2 nm CoFeB/1.2 nm Ru/10 nm NiFe. Furthermore, CoFeB has a pronounced magnetoelastic effect, that is to say that it changes its magnetization upon chip extension, which may be an undesirable property. Therefore, on the one hand, the CoFeB can be kept as thin as possible in order to reduce a sensitivity to extension, and, on the other hand, the CoFeB is required in order to obtain a high MR signal ratio. A CoFeB layer thickness in the FL design of 1-2 nm may be a good compromise. In accordance with some example implementations, the magnetically free layer system can have a vortex magnetization. For this purpose, the sensor element can have for example circular free layer structures having a diameter of e.g. 8-10 μm.

f) A capping layer 320 comprising TaN and Ru. The purpose of Ru is to provide an etch stop for an open hard mask used to define a mask for the actual MTJ structuring. The purpose of the TaN is to afford protection for the free layer and to function as a buffer during precleaning before the capping metal deposition. A possible construction of the capping layer is 20 nm TaN/5 nm Ru.

After stack deposition, the stack 300 can be subjected to heat treatment without a magnetic field at 280° C. for two hours, for example. This can be done either before or after the deposition of the hard mask. Care should be taken to ensure that no magnetic fields are present during the high-temperature processing.

For structuring the magnetic tunnel contacts, firstly a dielectric hard mask can be deposited onto the stack. The deposition can be effected at 200° C. in a CVD process. The hard mask can consist of 200 nm SiO$_2$ with an underlying layer of SiN having a thickness of 5 nm. During the etching of the oxides, the SiN serves as a signal layer for giving the etching system a stop signal. As soon as this signal is initiated, a sufficient over-etching can be applied in order to remove the entire hard mask material in the open region. The high selectivity of the etching chemistry vis-á-vis Ru offers a large process window.

After the hard mask has been opened, the resists that were used for defining the hard mask pattern can be removed and the actual MTJ stack can be structured using ion milling. In a first step, the etching is carried out at a relatively steep angle (typically 30° from the normal) until the Mg signal in the SIMS used for process control rises. At this point the wafer stage is tilted so that the etching angle is shallower (typically 70° from the normal). This ensures that any material that deposits on the sidewall of the tunnel barrier is completely removed, and avoids any shunt. The etching is then stopped in the antiferromagnet. Care should be taken to avoid etching too deeply into the antiferromagnet, since this can lead to a reduced signal.

After the shallow etching, the wafer can be moved without a vacuum pause into a PVD chamber, where an SiN layer (~30 nm) can be deposited at room temperature. This protects the junction sidewall against corrosion resulting from the surroundings.

For contacting two adjacent junctions, a bottom electrode of the MTJ stack 300 can be used. For this purpose, a further hard mask can be deposited on the wafer and can be structured in a similar manner to a top electrode. Since no tunnel barrier is uncovered in this case, the IBE etching can be carried out at a single angle.

After complete structuring of the stack, it is possible to deposit a further dielectric layer and to produce a via opening to the last metal of the basic process. It is important to supervise the effective optical dielectric thickness above the MTJs in order to be able to successfully magnetize the resistance locally using laser magnetization. The desired thickness of the dielectric material is nm (~290 nm oxide+30 nm SiN encapsulation) since the reflection for 1064 nm light exhibits a plateau with regard to the thickness variation, which enables a controlled magnetization process.

After magnetization, the top contact can be opened. Here, too, the Ru layer can be used as an etch stop. The Ru can be removed during the removal of the resist. The TaN layers thus constitute the interface to the subsequently deposited AlCu capping metal. In order to avoid any junction resistances both in the top contact and in the contact with the GM metal, an argon precleaner can be applied before the metal deposition. A sufficiently thick TaN layer is therefore required for protecting the TMR stack 300.

Although contacting the TMR stack 300 from below through W vias is possible in principle, it is recommended to avoid this since the vias would have to be positioned outside the barrier layer region (otherwise there is a high risk of a short circuit) and increased delamination would be observed. Therefore, the TMR components can generally be connected by way of the bottom electrode of the stack and be contacted from above with the aid of top vias, which can be formed as described above. The routing to the pads or an underlying circuit can be realized by way of the direct contact between topmost metal and topmost basic process metal. For this reason, an even number of MTJs should be connected in series.

The integration scheme described was developed for a last metal, comprising AlCu. Therefore, in principle, any technology that uses AlCu as last metal can be combined with the technology described. Of course, the influence of the TMR processing on the properties of the components of the basic technology should be assessed.

Figure 4:
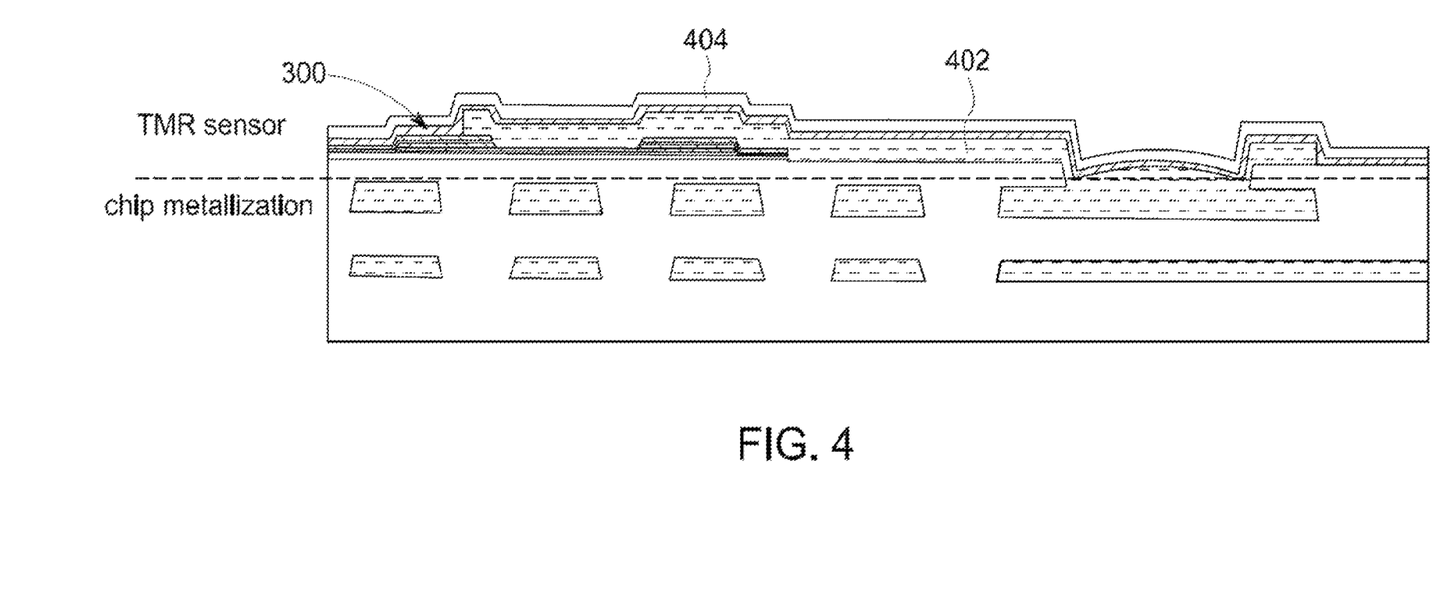
FIG. 4 shows a schematic cross section through a TMR module.

FIG. 4 shows a schematic cross section of the monolithic integration of a TMR sensor in a standard CMOS metallization. According to the modular approach, the sensor 300 lies on the last metal layer 402. Standard CMOS processes can be used for the processing, such that besides the TMR resistance elements further integrated circuit components can be integrated on the common semiconductor substrate.

Figure 5:
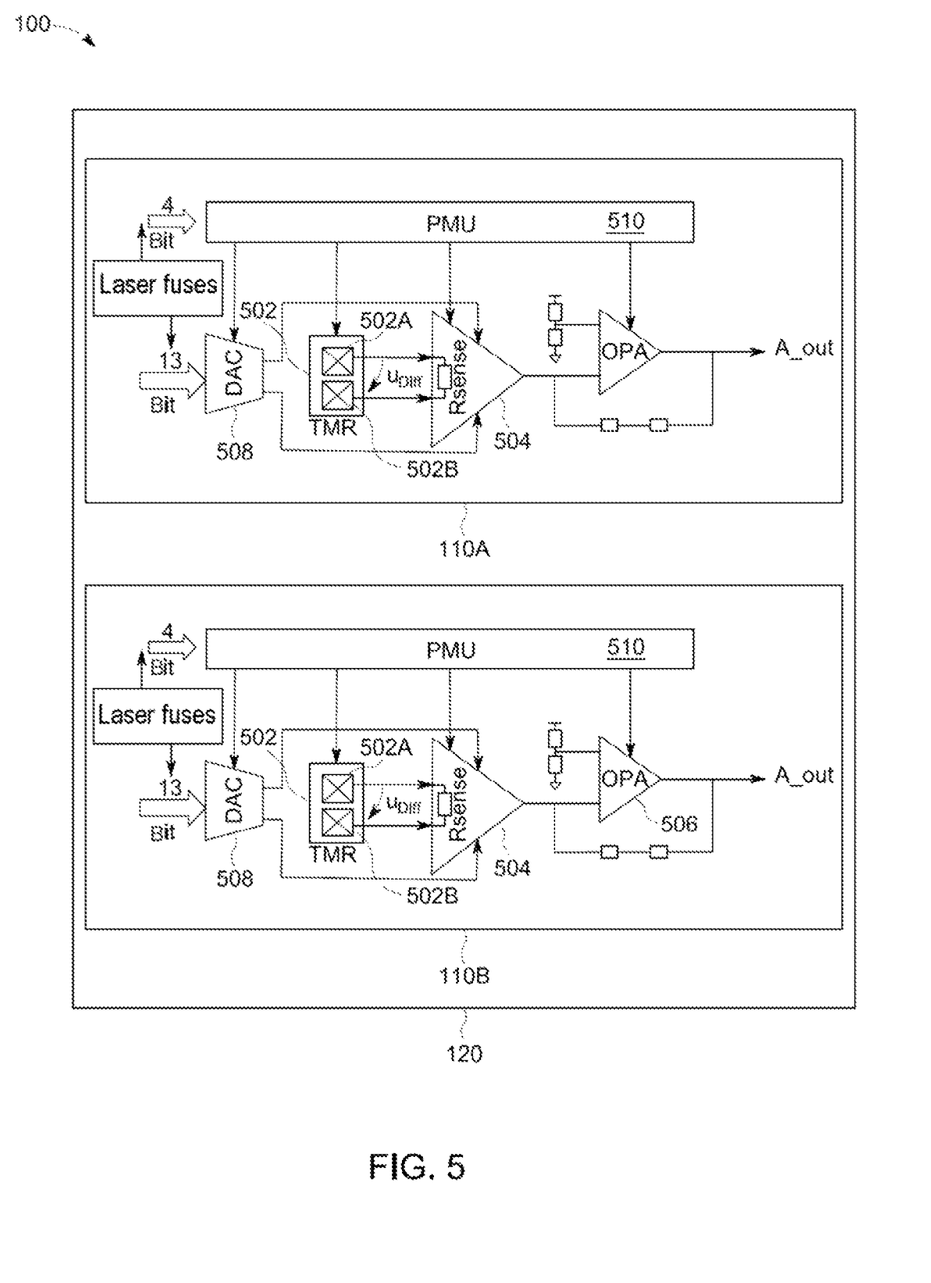
FIG. 5 shows a first example implementation of a redundantly configured TMR current sensor.

As has already been mentioned further above, besides TMR resistance elements or full bridges realized using TMR layer stacks 300, the integrated TMR sensor circuits 110A, 110B can additionally have further monolithically integrated circuit components. FIG. 5 shows one example implementation of the redundant current sensor 100 comprising a first integrated TMR sensor circuit 110A and a second integrated TMR sensor circuit 110B. In this case, the first and second integrated TMR sensor circuits 110A, 110B are arranged in a common semiconductor or chip package 120. As has already been described, the two integrated TMR sensor circuits 110A, 110B can be jointly integrated on a common die (of a semiconductor wafer). The two integrated TMR sensor circuits 110A, 110B can also each be integrated on different dies and mounted on a common leadframe, for example. Advantageously, they are galvanically isolated from one another, such that they cannot have an adverse effect on one another and can yield reliable measurement signals that are independent of one another.

Each of the integrated TMR sensor circuits 110A, 110B shown in FIG. 5 comprises an integrated (Wheatstone) bridge circuit 502 having four TMR resistance elements (see FIG. 2) arranged in two half-bridges 502A, 502B for providing a respective differential measurement signal (differential measurement voltage) $U_{Diff}$. Each of the integrated TMR sensor circuits 110A, 110B furthermore comprises a differential amplifier circuit 504, which is monolithically integrated with the respective TMR bridge circuit 502 on a common semiconductor substrate and which is configured to amplify the respective measurement signal (differential measurement voltage) $U_{Diff}$. A differential input of the differential amplifier 504 is thus coupled to a differential output of the bridge circuit 502. The differential amplifier 504 provides an amplified measurement signal at its output. The first integrated TMR sensor circuit 110A can thus have a first amplifier 504 integrated with the first TMR sensor 502 on a common semiconductor substrate. Equally, the second integrated TMR sensor circuit 110B can have a second amplifier 504 integrated with the second TMR sensor 502 on a common semiconductor substrate.

The output of the respective differential amplifier 504 is coupled to a first input of a respective operational amplifier 506, which provides a respective analog output signal $A_{out}$ at its output. The respective operational amplifier 506 can be integrated together with the respective TMR bridge circuit 502 and the respective differential amplifier 504 on a common semiconductor substrate using a CMOS process. The respective differential amplifier 504 can be calibrated (offset, temperature) by way of a respective digital-to-analog converter 508. The respective digital-to-analog converter 508 can be integrated together with the respective TMR bridge circuit 502, the respective differential amplifier 504 and/or the respective operational amplifier 506 on a common semiconductor substrate using a CMOS process and can thus form the respective integrated TMR sensor circuit 110A, 110B. All integrated circuit components can be supplied with electrical supply energy by way of a respective power supply unit 510. The respective power supply unit 510 can likewise be integrated together with the respective TMR bridge circuit 502 on the common semiconductor substrate.

Figure 6A:
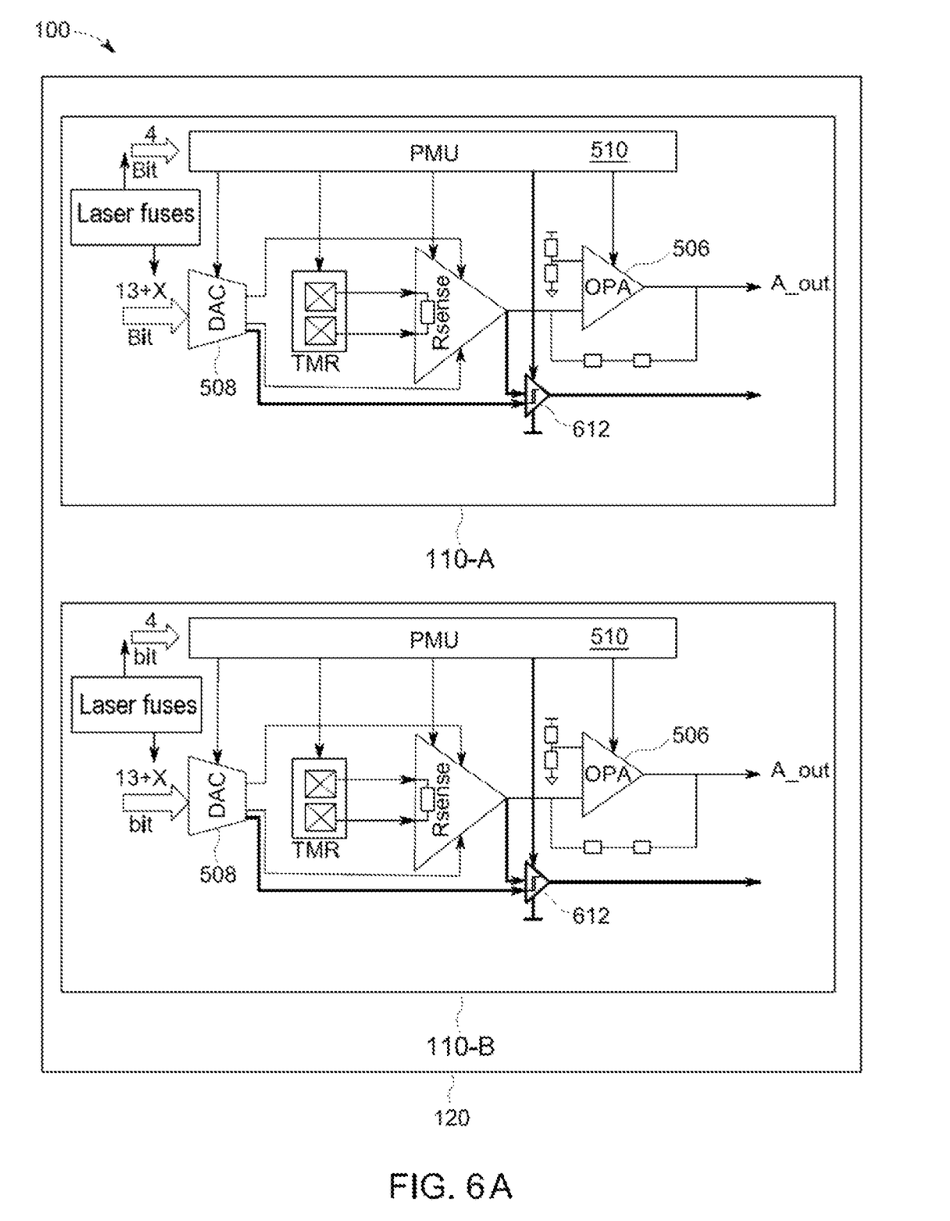
FIG. 6A shows a further example implementation of a redundantly configured TMR current sensor.

FIG. 6A shows one example implementation of the redundant current sensor 100 comprising a first integrated TMR sensor circuit 110A and a second integrated TMR sensor circuit 110B, which each have an integrated comparator 612 in addition to the integrated circuit components shown in FIG. 5. The comparator 612 can compare the output of the differential amplifier 504 with a threshold value that is programmable by way of the DAC 508. If the measurement signal exceeds the threshold value, for example a respective overcurrent signal (OCD) can additionally be output. The first integrated TMR sensor circuit 110A can thus have a first comparator 612 integrated with the first TMR sensor 502 on a common semiconductor substrate. Equally, the second integrated TMR sensor circuit 110B can have a second comparator 612 integrated with the second TMR sensor 502 on a common semiconductor substrate.

Figure 6B:
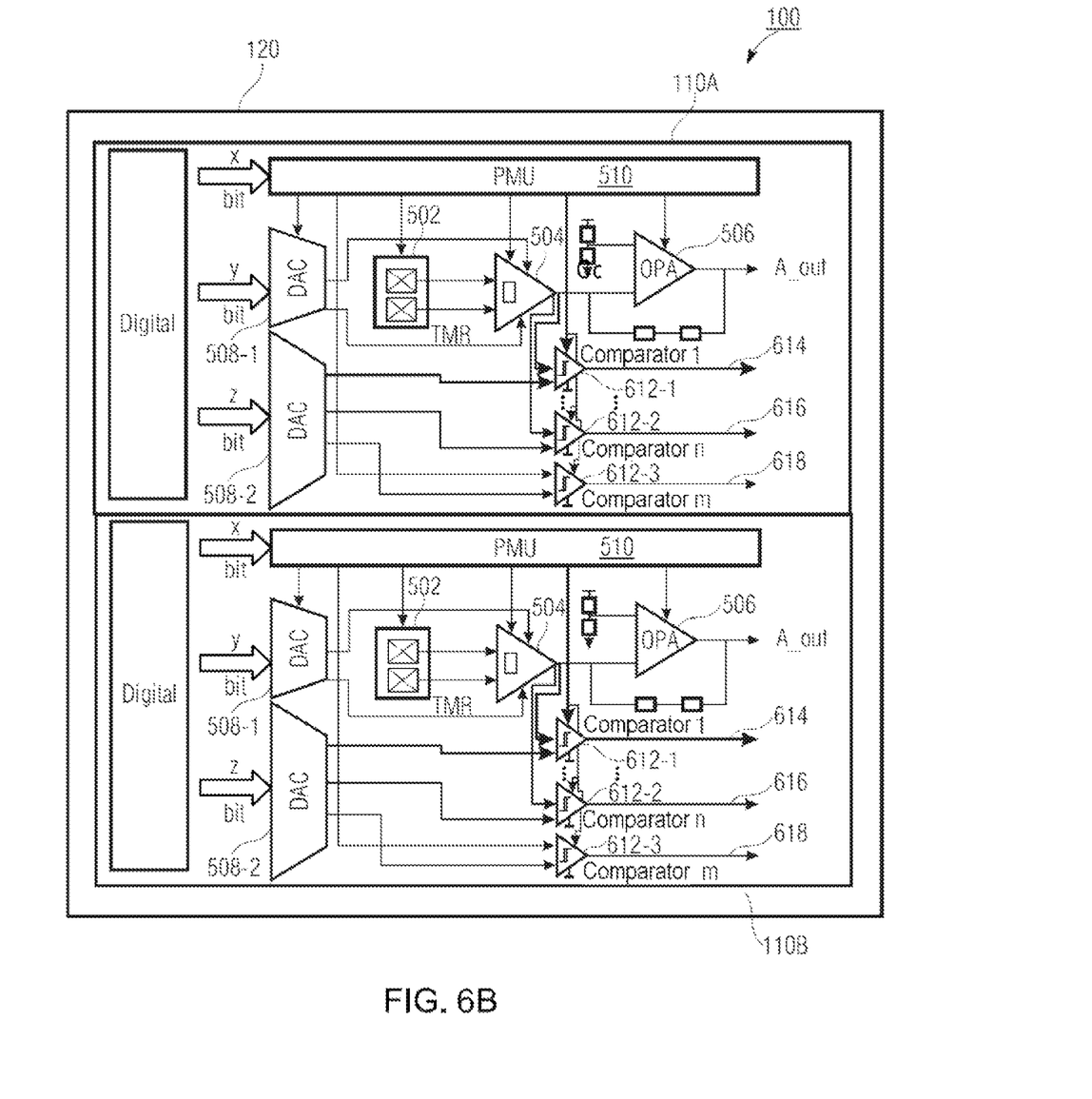
FIG. 6B shows a further example implementation of a redundantly configured TMR current sensor.

FIG. 6B shows a further example implementation of the redundant current sensor 100 comprising a first integrated TMR sensor circuit 110A and a second integrated TMR sensor circuit 110B, which ach have two further integrated comparators 612-2, 612-3 in addition to the integrated circuit components shown in FIG. 6A. The comparator 612-1 can compare the output of the differential amplifier 504 with a threshold value that is programmable by way of the DAC 508-2. If the measurement signal exceeds the threshold value, for example a respective overcurrent signal (OCD) 614 can additionally be output. The comparator 612-2 can compare the output of the differential amplifier 504 with a threshold value (e.g. zero) that is programmable by way of the DAC 508-2. If the measurement signal exceeds or falls below the threshold value, for example a respective zero crossing signal 616 can additionally be output. The comparator 612-3 can compare a temperature measurement value output of the power supply unit 510 with a threshold value that is programmable by way of the DAC 508-2. If the temperature measurement signal exceeds the threshold value, for example a respective temperature value can additionally be output 618. The first integrated TMR sensor circuit 110A can thus have more than one comparator 612 integrated with the first TMR sensor 502 on a common semiconductor substrate. Equally, the second integrated TMR sensor circuit 110B can have more than one comparator 612 integrated with the second TMR sensor 502 on a common semiconductor substrate.

Figure 7A:
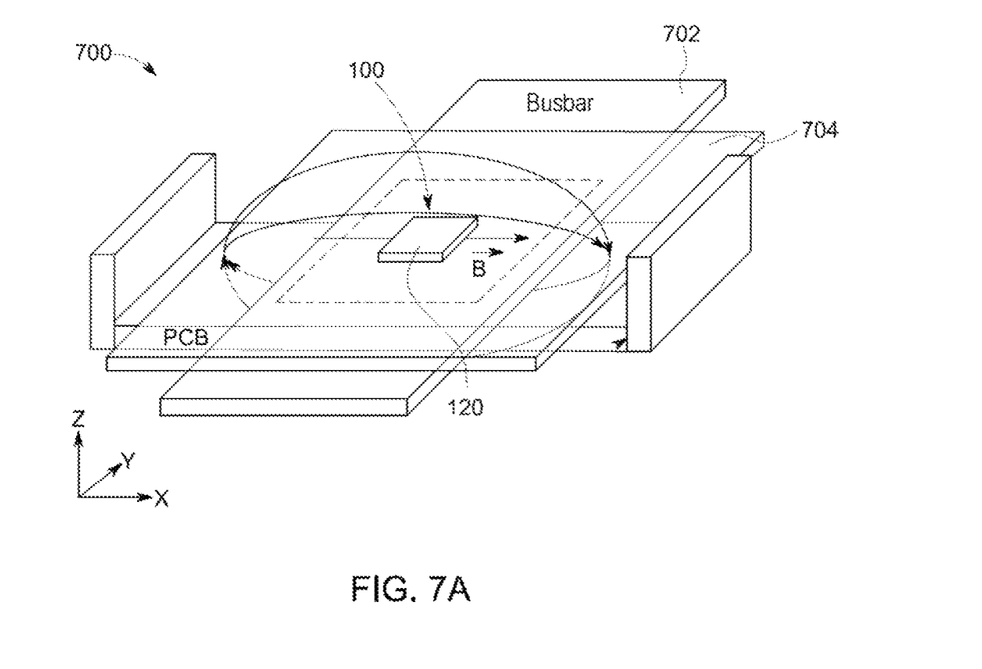
FIGS. 7A and 7B show an arrangement for current measurement in accordance with one example implementation of the present disclosure.
Figure 7B:
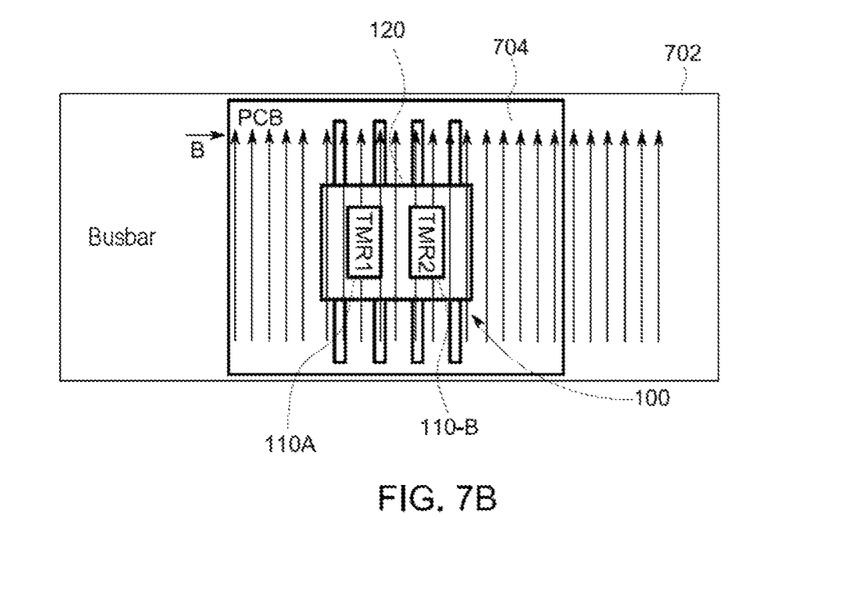

FIGS. 7A,B schematically show an arrangement 700 for non-contact current measurement with one example implementation of the redundantly configured current sensor 100. While FIG. 7A shows a perspective view of the measuring arrangement 700, FIG. 7B shows a schematic plan view.

FIG. 7A shows a redundantly configured magnetic field or current sensor 100 arranged above a busbar 702 on a printed circuit board 704. The current sensor 100 has a first integrated TMR sensor circuit 110A and a second integrated TMR sensor circuit 110B (not shown) in a common semiconductor package 120. By way of outputs or terminals (not shown) of the semiconductor package 120, the integrated TMR sensor circuits 110A, 110B can provide respective redundant sensor signals $A_{out}$ corresponding to the magnetic field B caused by the current flow through the busbar 702, the magnetic field being measured using the respective TMR bridge circuit 502. A logic circuit (not shown) coupled to the redundantly configured magnetic field sensor 100 can be configured to compare the first sensor signal of the first integrated TMR sensor circuit 110A with the second sensor signal of the second integrated TMR sensor circuit 110B and to output a warning or error signal, for example, if the two sensor signals deviate from one another too much.

In the configuration shown, the integrated TMR sensor circuits 110A, 110B can each measure a magnetic field in the x-y-plane, for example an x-component. In the arrangement shown in FIG. 7, the magnetically free layers of the TMR resistance elements of the sensor circuits 110A, 110B can thus likewise extend in the x-y-plane. Generally, in-plane magnetic fields can thus be measured. On account of the common integration in the semiconductor package 120, the TMR sensor circuits 110A, 110B can be positioned so close to one another that they measure substantially the same magnetic field in terms of absolute value. The measuring bridges 502 of the integrated TMR sensor circuits 110A, 110B can be at a distance from one another of less than 3 mm, for example.

Figure 8A:
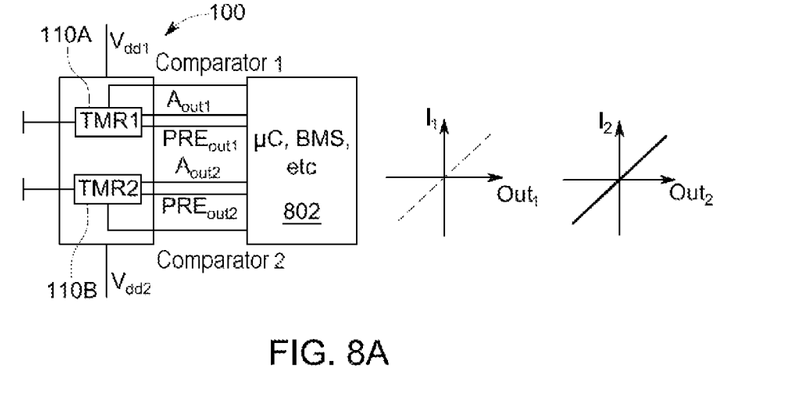
FIGS. 8A-8C show various configurations of first and second integrated TMR sensor circuits.
Figure 8B:
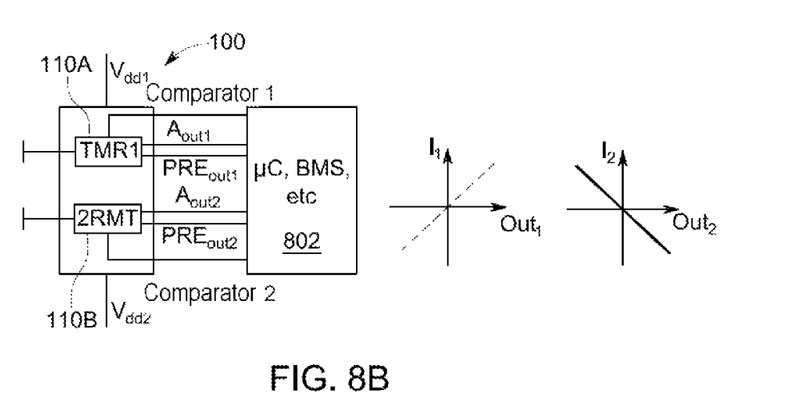
Figure 8C:
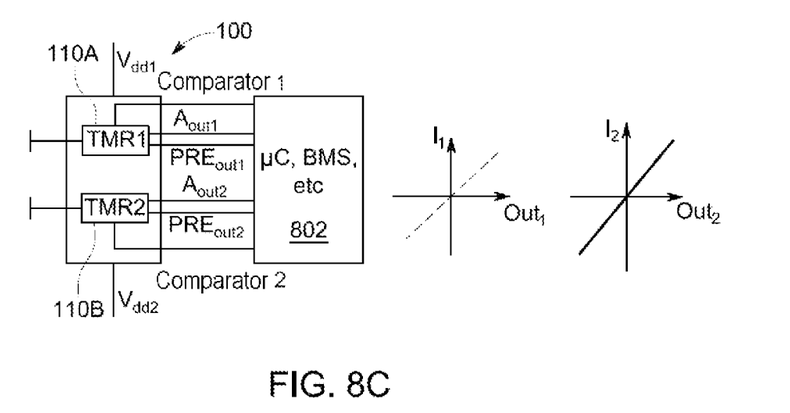

FIGS. 8A-C schematically show various configurations of the first and second integrated TMR sensor circuit 110A, 110B. FIGS. 8A-C each show a dual die configuration with two identical integrated TMR sensor circuits 110A, 110B, each of which has an independent supply terminal, an independent ground terminal and an independent analog out pin. An independent signal tap at the individual measuring bridges is additionally possible (PREoutx), with a signal delay time of 10 ns, for example. Optionally, an independent comparator pin (e.g. OCD pin) can be activated in each case.

FIG. 8A shows for example a configuration in which the first integrated TMR sensor circuit 110A and the second integrated TMR sensor circuit 110B have the same magnetic sensing properties. The sensors operate in parallel with the same sensitivity range and settings. That can be achieved for example using identically configured TMR layer stacks in the TMR sensor circuits 110A, 110B. That means that given identical current through the current conductor 702, both TMR sensor circuits 110A, 110B also output to a microcontroller or BMS 802 substantially identical measurement signals $A_{out}$ in terms of absolute value in the error-free case. The microcontroller or BMS 802 is configured to compare a first measurement signal $A_{out1}$ of the first integrated TMR sensor circuit 110A with a second measurement signal $A_{out2}$ of the second integrated TMR sensor circuit 110B and to output a warning signal, if appropriate, e.g., in the case of an excessively large deviation.

FIGS. 8B and 8C each show configurations in which the first integrated TMR sensor circuit 110A and the second integrated TMR sensor circuit 110B have different magnetic sensing properties. While in accordance with FIG. 8B the first integrated TMR sensor circuit 110A has a positive relationship between current and output signal, the second integrated TMR sensor circuit 110B has a negative relationship, that is to say outputs $-A_{out}$ instead of $+A_{out}$ in the case of current I, for example. The sensors operate with antiparallel sensitivity ranges and settings. This can be achieved for example using different reference magnetizations (e.g. different by 180°) of the first integrated TMR sensor circuit 110A and the second integrated TMR sensor circuit 110B. In the example implementation shown in FIG. 8C, the two integrated TMR sensor circuits 110A, 110B have different sensitivities. The sensors operate in parallel with different sensitivity ranges and settings. In the case of a specific current I, an output signal $A_{out2}$ of the second integrated TMR sensor circuit 110B is lower than an output signal $A_{out1}$ of the first integrated TMR sensor circuit 110A. This can be achieved for example using free layers of different thicknesses in the TMR sensors.

In summary, the present disclosure thus proposes using the smallest possible integrated xMR current sensors and accommodating them in one package. Multi-chip sensors having discrete sensor elements and a logic chip with circuit cannot be compared with the proposals described herein.

The aspects and features that have been described in association with a specific one of the examples above can also be combined with one or more of the further examples in order to replace an identical or similar feature of this further example or in order additionally to introduce the feature into the further example.

Where some aspects in the preceding sections have been described in association with a device or a system, these aspects should also be understood as a description of the corresponding method. In this case, for example, a block, a device or a functional aspect of the device or of the system can correspond to a feature, for instance a method step, of the corresponding method. Analogously thereto, aspects described in association with a method should also be understood as a description of a corresponding block, a corresponding element, a property or a functional feature of a corresponding device or a corresponding system.

The claims that follow are hereby incorporated in the detailed description, where each claim can be representative of a separate example by itself. Furthermore, it should be taken into consideration that—although a dependent claim refers in the claims to a specific combination with one or more other claims—other examples can also encompass a combination of the dependent claim with the subject matter of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

What is claimed is:

1. A current sensor, comprising
a first integrated circuit including a first magnetoresistive sensor; and
a second integrated circuit including a second magnetoresistive sensor,
wherein the first integrated circuit includes a first amplifier and the second integrated circuit includes a second amplifier,
wherein each of the first integrated circuit and the second integrated circuit further includes at least two of:
a first comparator configured to compare an output of a respective amplifier, of the first amplifier or the second amplifier, with a first threshold value and output a first measurement signal when the output of the respective amplifier exceeds the first threshold value,
a second comparator configured to compare the output of the respective amplifier with a second threshold value and output a second measurement signal when the output of the respective amplifier exceeds the second threshold value, or
a third comparator configured to compare an output of a power supply unit with a third threshold value and output a third measurement signal when the output of the power supply unit exceeds the third threshold value, and
wherein the first integrated circuit and the second integrated circuit are arranged in a common semiconductor package.

2. The current sensor as claimed in claim 1, wherein the first magnetoresistive sensor further includes a first integrated bridge circuit having first magnetoresistive elements, and wherein the second magnetoresistive sensor further includes a second integrated bridge circuit having second magnetoresistive elements.

3. The current sensor as claimed in claim 1, wherein the first magnetoresistive sensor and the second magnetoresistive sensor are configured to measure a same magnetic field component of a magnetic field generated by a current.

4. The current sensor as claimed in claim 1, wherein the first amplifier is integrated with the first magnetoresistive sensor on a first common semiconductor substrate, and wherein the second amplifier is integrated with the second magnetoresistive sensor on a second common semiconductor substrate.

5. The current sensor as claimed in claim 1, wherein the at least two of the first comparator, the second comparator, or the third comparator is integrated with the first integrated circuit on a first common semiconductor substrate and with the second integrated circuit on a second common semiconductor substrate.

6. The current sensor as claimed in claim 1, wherein the first integrated circuit further includes a first digital-to-analog converter integrated with the first magnetoresistive sensor on a first common semiconductor substrate, and wherein the second integrated circuit further includes a second digital-to-analog converter integrated with the second magnetoresistive sensor on a second common semiconductor substrate.

7. The current sensor as claimed in claim 1, wherein the first integrated circuit and the second integrated circuit are arranged on a common semiconductor chip.

8. The current sensor as claimed in claim 1, wherein the first integrated circuit and the second integrated circuit are arranged on different semiconductor chips.

9. The current sensor as claimed in claim 1, wherein the first integrated circuit and the second integrated circuit are galvanically isolated from one another.

10. The current sensor as claimed in claim 1, wherein the first magnetoresistive sensor is configured as a first tunnel magnetoresistance (TMR) sensor and the second magnetoresistive sensor is configured as a second TMR sensor.

11. The current sensor as claimed in claim 1, wherein the first magnetoresistive sensor and the second magnetoresistive sensor have a magnetically free layer in a vortex configuration.

12. The current sensor as claimed in claim 1, wherein a magnetic sensing property of the first magnetoresistive sensor is the same as a magnetic sensing property of the second magnetoresistive sensor.

13. The current sensor as claimed in claim 1, wherein a distance between the first magnetoresistive sensor and the second magnetoresistive sensor in the common semiconductor package is less than 3 mm.

14. The current sensor as claimed in claim 1, wherein the first integrated circuit further includes a first bridge circuit having a plurality of first magnetoresistive sensor elements, and wherein the second integrated circuit further includes a second bridge circuit having a plurality of second magnetoresistive sensor elements.

15. The current sensor as claimed in claim 1, further comprising a logic circuit configured to compare a first sensor signal of the first magnetoresistive sensor with a second sensor signal of the second magnetoresistive sensor.

16. The current sensor as claimed in claim 1, wherein a magnetic sensing property of the first magnetoresistive sensor is different from a magnetic sensing property of the second magnetoresistive sensor.

17. The current sensor as claimed in claim 16, wherein a measurement sensitivity of the first magnetoresistive sensor is different from a measurement sensitivity of the second magnetoresistive sensor.

18. An arrangement for current measurement, comprising:
a current conductor;
a redundantly configured magnetic field sensor, arranged at a distance from the current conductor, including a first integrated magnetoresistive sensor circuit and a second integrated magnetoresistive sensor circuit in a common semiconductor package,
   wherein the first integrated magnetoresistive sensor circuit includes a first amplifier and the second integrated magnetoresistive sensor circuit includes a second amplifier,
   wherein each of the first integrated magnetoresistive sensor circuit and the second integrated magnetoresistive sensor circuit further includes at least two of:
      a first comparator configured to compare an output of a respective amplifier, of the first amplifier or the second amplifier, with a first threshold value and output a first measurement signal when the output of the respective amplifier exceeds the first threshold value,
      a second comparator configured to compare the output of the respective amplifier with a second threshold value and output a second measurement signal when the output of the respective amplifier exceeds the second threshold value, or
      a third comparator configured to compare an output of a power supply unit with a third threshold value and output a third measurement signal when the output of the power supply unit exceeds the third threshold value; and
a logic circuit coupled to the redundantly configured magnetic field sensor and configured to compare a first sensor signal of the first integrated magnetoresistive sensor circuit with a second sensor signal of the second integrated magnetoresistive sensor circuit.

19. A method for current measurement, comprising:
energizing a current conductor;
arranging a redundantly-configured magnetic field sensor at a distance from the current conductor, wherein the redundantly-configured magnetic field sensor includes a first integrated magnetoresistive sensor circuit and a second integrated magnetoresistive sensor circuit in a common semiconductor package, wherein the first integrated magnetoresistive sensor circuit includes a first amplifier and the second integrated magnetoresistive sensor circuit includes a second amplifier, wherein each of the first integrated magnetoresistive sensor circuit and the second integrated magnetoresistive sensor circuit further includes at least two of:
   a first comparator configured to compare an output of a respective amplifier, of the first amplifier or the second amplifier, with a first threshold value and output a first measurement signal when the output of the respective amplifier exceeds the first threshold value,
   a second comparator configured to compare the output of the respective amplifier with a second threshold value and output a second measurement signal when the output of the respective amplifier exceeds the second threshold value, or
   a third comparator configured to compare an output of a power supply unit with a third threshold value and output a third measurement signal when the output of the power supply unit exceeds the third threshold value;
sensing, based on energizing the current conductor, a first sensor signal of the first integrated magnetoresistive sensor circuit and a second sensor signal of the second integrated magnetoresistive sensor circuit; and
comparing the first sensor signal with the second sensor signal.

20. The method as claimed in claim 19, wherein the first integrated magnetoresistive sensor circuit further includes a first integrated bridge circuit having first magnetoresistive elements, and wherein the second integrated magnetoresistive sensor circuit further includes a second integrated bridge circuit having second magnetoresistive elements.

* * * * *